United States Patent
Hilker

(10) Patent No.: US 11,965,913 B2
(45) Date of Patent: Apr. 23, 2024

(54) MEASUREMENT ARRANGEMENT FOR MEASURING A VOLTAGE POTENTIAL ON A CONDUCTOR IN A POWER SWITCHING DEVICE AND CORRESPONDING POWER SWITCHING DEVICE

(71) Applicant: Siemens Energy Global GmbH & Co. KG, Munich (DE)

(72) Inventor: Thomas Hilker, Stahnsdorf (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 222 days.

(21) Appl. No.: 17/642,826

(22) PCT Filed: Aug. 17, 2020

(86) PCT No.: PCT/EP2020/072956
§ 371 (c)(1),
(2) Date: Mar. 14, 2022

(87) PCT Pub. No.: WO2021/047858
PCT Pub. Date: Mar. 18, 2021

(65) Prior Publication Data
US 2022/0373578 A1 Nov. 24, 2022

(30) Foreign Application Priority Data
Sep. 13, 2019 (DE) ...................... 10 2019 213 995.7

(51) Int. Cl.
*G01R 15/16* (2006.01)
*G01R 19/00* (2006.01)

(52) U.S. Cl.
CPC ......... *G01R 15/16* (2013.01); *G01R 19/0084* (2013.01)

(58) Field of Classification Search
CPC ..... G01R 15/06; G01R 15/16; G01R 19/0084
See application file for complete search history.

(56) References Cited

U.S. PATENT DOCUMENTS

| 7,064,267 B2 * | 6/2006 | Kato | ..................... H01H 33/027 174/41 |
| 11,422,169 B2 * | 8/2022 | Ferraro | ................. G01R 19/175 |
| 2005/0135028 A1 | 6/2005 | Kato et al. | |
| 2014/0028319 A1 | 1/2014 | Abe et al. | |

FOREIGN PATENT DOCUMENTS

| CN | 106716148 A * | 5/2017 | ............. G01R 15/06 |
| DE | 3935181 A1 | 4/1991 | |
| DE | 19830067 C1 | 3/2000 | |

(Continued)

*Primary Examiner* — Jay Patidar
(74) *Attorney, Agent, or Firm* — Laurence A. Greenberg; Werner H. Stemer; Ralph E. Locher

(57) ABSTRACT

A voltage potential measurement arrangement for measuring a voltage potential on a conductor in an encapsulated power switching device includes at least a portion of the conductor surrounded by a field control component, in particular a field control electrode, having a measuring electrode for capacitive coupling to the conductor. The measuring electrode is disposed outside of the field control component and the field control component is penetrated by at least one aperture at the height of the measuring electrode. A corresponding encapsulated power switching device is also provided.

11 Claims, 1 Drawing Sheet

(56) References Cited

FOREIGN PATENT DOCUMENTS

| | | |
|---|---|---|
| DE | 19855528 A1 | 6/2000 |
| EP | 0424699 B1 | 6/1994 |
| JP | H044709 A | 1/1992 |
| JP | H0729471 U | 6/1995 |
| JP | H0729473 U | 6/1995 |
| JP | H07140178 A | 6/1995 |
| JP | H08124753 A | 5/1996 |
| JP | 2006337357 A | 12/2006 |
| JP | 2013165596 A | 8/2013 |
| WO | 0165653 A1 | 9/2001 |
| WO | WO 2010070693 A1 | 6/2010 |
| WO | 2012157138 A1 | 11/2012 |
| WO | WO-2014060106 A1 * | 4/2014 ........... G01R 15/142 |

\* cited by examiner

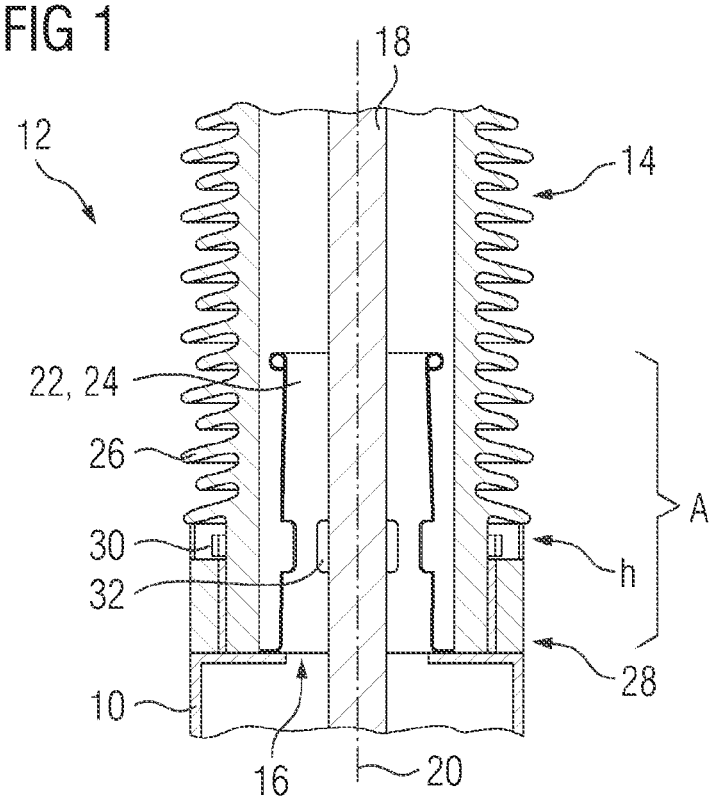
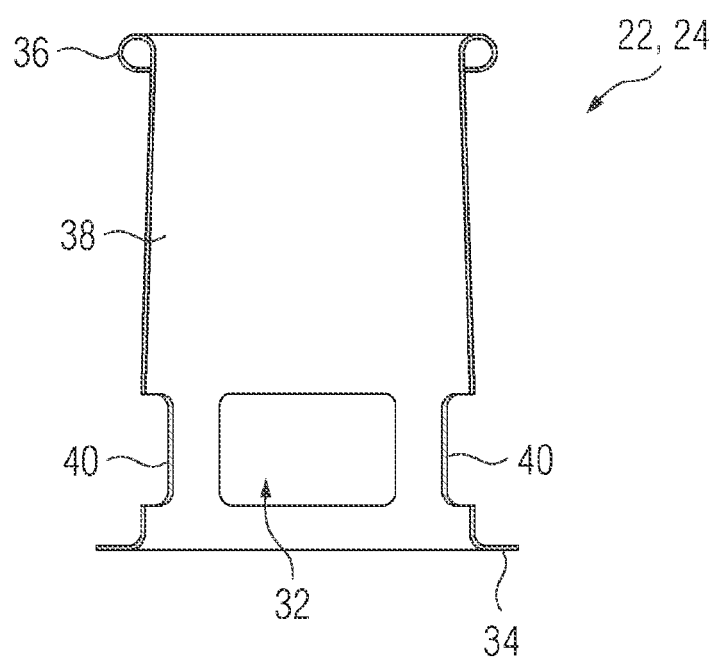

MEASUREMENT ARRANGEMENT FOR MEASURING A VOLTAGE POTENTIAL ON A CONDUCTOR IN A POWER SWITCHING DEVICE AND CORRESPONDING POWER SWITCHING DEVICE

FIELD AND BACKGROUND OF THE INVENTION

The invention relates to a voltage potential measurement arrangement for measuring a voltage potential at a conductor in the interior of an encapsulated power switching device, in which at least one portion of the conductor is surrounded by a substantially field control component, in particular a field control electrode, having a measurement electrode for capacitive coupling to the conductor.

The invention also relates to a corresponding encapsulated power switching device.

Power switching devices (circuit breakers) close or open current paths of high voltages and electric currents. Current and voltage are measured by current or voltage transformers. Measurement of a voltage potential at a conductor (primary conductor) takes place via capacitive coupling between this conductor and the measurement electrode. For this purpose, the measurement electrode has to be arranged in the immediate vicinity of this conductor. Electrically conductive housing components of the encapsulation shield the electric field of the conductor. Field-controlling components, such as the control electrode of a high-voltage bushing of a dead tank switching apparatus, also have a shielding effect. The measurement electrode can therefore also not be mounted at those installation locations that are used for current transformers, for example. In many cases, the measurement electrode is therefore installed in the insulating-gas-filled switch housing and is therefore located in the immediate vicinity of the conductor. The electric field of the conductor can therefore act on the measurement electrode without being influenced.

Document DE 198 30 067 C1 shows a voltage potential measurement arrangement for measuring a voltage potential at a conductor, referred to as a current path, in the interior of an encapsulated power switching device in the form of a gas-blast circuit breaker, in which at least one portion of the conductor is surrounded by an outer contour in the form of a shielding electrode, having a measurement electrode for capacitive coupling to the conductor.

In present embodiments of such a power switching device, the field control component is in the form of a substantially sleeve-shaped field control electrode.

SUMMARY OF THE INVENTION

The invention is based on the object of specifying a voltage potential measurement arrangement for measuring a voltage potential at a conductor in the interior of an encapsulated power switching device and also a corresponding encapsulated power switching device that open up new installation options for the measurement electrode, in particular such installation options that allow the measurement electrode to be mounted in a simple manner.

The object is achieved according to the invention by the features of the independent claims.

Advantageous refinements of the invention are the subject matter of the dependent claims.

In the case of the voltage potential measurement arrangement, according to the invention, for measuring a voltage potential at a conductor in the interior of an encapsulated power switching device, in which at least one portion of the conductor is surrounded by a field control component, having a measurement electrode for capacitive coupling to the conductor, provision is made for the measurement electrode to be arranged outside of the field control component and for at least one aperture to pass through the field control component at the height of the measurement electrode. Said aperture is a type of window and forms a passage for field lines between the conductor and the measurement electrode. These form the electrodes of a capacitor. In this way, there can be capacitive coupling between the conductor and the measurement electrode despite the presence of the field control component. The field control component is preferably a field control electrode, in particular a substantially sleeve-shaped field control electrode.

These measures give rise to new installation options for the measurement electrode. In this way, it is now possible to allow measurement of the voltage potential even in the vicinity of a current measurement of the electric current through the conductor.

According to one preferred embodiment of the invention, the measurement electrode is of annular configuration and a plurality of circumferentially distributed apertures pass through the field control component at the height of the measurement electrode. An annular measurement electrode, surrounding the conductor, for measuring a voltage potential at a conductor has proven successful.

According to a further preferred embodiment of the invention, the encapsulation is in the form of a high-voltage insulator circumferentially surrounding the field control component at least at the height of the measurement electrode. The high-voltage insulator is usually made from a ceramic- or glass-fiber-reinforced plastic/silicone composite material.

Power switching devices (or circuit breakers) usually have high-voltage insulators of this kind in their high-voltage bushings. Accordingly, in the case of this measurement arrangement, the voltage potential at the conductor is measured in the region of a high-voltage bushing of the encapsulated power switching device. A current through the conductor is also advantageously measured there.

In this case, the measurement electrode is in particular also arranged outside of the high-voltage insulator. This high-voltage insulator is a type of dielectric window and forms a passage for field lines between the conductor and the measurement electrode. The measurement electrode can be mounted in a particularly simple manner outside of the high-voltage insulator.

According to yet another preferred embodiment of the invention, the field control component directly adjoins a switch housing of the power switching device. Such an arrangement of the switch housing and field control component is provided in many power switching devices.

Provision is advantageously made for at least two of the components out of the conductor, field control component and measurement electrode to be oriented coaxially. The high-voltage insulator is also often oriented coaxially thereto. Such an arrangement often arises in high-voltage bushings.

In the encapsulated power switching device according to the invention, having (i) a switch unit, (ii) a conductor electrically connected to the switch unit, (iii) an encapsulation, (iv) a field control component, and (v) a measurement electrode for measuring a voltage potential at the conductor, provision is made for the measurement electrode to be arranged outside of the field control component and for at least one aperture to pass through the field control component at the height of the measurement electrode.

In other words, the above-mentioned voltage potential measurement arrangement for measuring a voltage potential at a conductor in the interior of the encapsulated power switching device is implemented in this power switching device.

One refinement of the encapsulated power switching device according to the invention makes provision for the measurement electrode to be of annular configuration and for a plurality of circumferentially distributed apertures to pass through the field control component at the height of the measurement electrode.

In a further refinement of the encapsulated power switching device according to the invention, provision is made for the encapsulation to be in the form of a high-voltage insulator circumferentially surrounding the field control component at least at the height of the measurement electrode, wherein the measurement electrode is preferably also arranged outside of the high-voltage insulator.

Provision is preferably made for the field control component to directly adjoin a switch housing, which houses the switch unit, of the power switching device.

The above-described properties, features and advantages of this invention and the manner in which they are achieved become clearer and more distinctly comprehensible in connection with the following description of exemplary embodiments which are explained in more detail in connection with the drawings.

BRIEF DESCRIPTION OF THE FIGURES

FIG. 1 shows a high-voltage bushing, which adjoins a switch housing, of an encapsulated power switching device according to one embodiment of the invention in a sectional illustration, and FIG. 2 shows a field control electrode arranged in this part of the high-voltage bushing.

DETAILED DESCRIPTION OF THE INVENTION

FIG. 1 shows a part, which adjoins a switch housing 10, of an encapsulated power switching device 12 in a sectional illustration. This part of the encapsulated power switching device 12 is a high-voltage bushing 14. The part shown by the switch housing 10 is a substantially cylindrical connecting piece and at its head end has an aperture 16, through which a conductor 18 leads out of the switch housing 10 and leads into the high-voltage bushing 14.

In power switching devices 12 of this kind, the switch housing 10 houses one or more switching units (not shown in this case). The shown cylindrical connecting piece of the switch housing 10 and the conductor 18 are arranged coaxially, that is to say are on a common axis 20.

A field control component 24 in the form of a substantially sleeve-shaped field control electrode 22 is flange-connected to the head end of the shown part of the switch housing 10, which field control component surrounds the conductor 18 over the full circumference in a portion A of the conductor 18. The sleeve-shaped field control electrode 22 is then, for its part, surrounded by a—preferably ceramic—high-voltage insulator 26 over the full circumference, which high-voltage insulator forms a part of the high-voltage bushing 14. The field control electrode 22 and the high-voltage insulator 26 are also oriented coaxially with respect to the axis 20. The switch housing 10 and the high-voltage insulator 26 are parts of the encapsulation 28 of the encapsulated power switching device 12.

An annular measurement electrode 30 surrounds the high-voltage insulator 26 at the height h of the portion A. A plurality of circumferentially distributed apertures 32 pass through the field control component 24 in the form of a field control electrode 22 at the height of the measurement electrode 30, which apertures each form a passage between the conductor 18 and the measurement electrode 30.

In the region of the high-voltage bushing 14, there is therefore a voltage potential measurement arrangement for measuring a voltage potential at the conductor 18 arranged in the interior of the encapsulated power switching device 12, in which at least the portion A of the conductor 18 within the high-voltage bushing 14 is surrounded by a field control electrode 22. The arrangement has a measurement electrode 30 for capacitive coupling to the conductor 18, which measurement electrode is arranged outside of the field control electrode 22, wherein a plurality of apertures 32 between the conductor 18 and the measurement electrode 30 pass through this field control electrode 22 at the height of the measurement electrode 30. The field control electrode 22 and the portion A of the conductor 18 are located in the interior of the high-voltage bushing 14, and the measurement electrode 30 surrounds the outer circumference of the high-voltage bushing 14 at the height h.

The encapsulated power switching device 12 can be in the form of a vacuum power switching device 12 or is—as in this case—a gas-filled power switching device 12. This can be configured as what is known as a live tank and dead tank circuit breaker or as a hybrid circuit breaker.

FIG. 2 shows the field control electrode 22, which is arranged in the high-voltage bushing 14 (shown in FIG. 1), in a further sectional illustration. This field control electrode 22 is of sleeve-shaped configuration and is manufactured from sheet metal, for example. At one end of the field control electrode 22, there is a collar 34, via which the field control electrode 22 can be mounted on (flange-connected to) the switch housing 10. At the other end of the field control electrode 22, there is an annularly flanged rim 36 that, among other things, stabilizes the shape of the field control electrode 22 at this "open end". The apertures 32 are arranged considerably closer to the end with the collar 34 than to the open end (the other end with the annularly flanged rim 36).

The radially running apertures 32 formed in the wall 38 have a uniform rectangular contour and are arranged circumferentially in such close succession that only very narrow bars 40 remain between them, the respective widths of which are considerably smaller than the dimensions of the apertures (openings) 32. In the example shown in FIG. 2, the bars 40 have a width of less than a third of the circumferential extent of the apertures 32.

Essential details of the voltage potential measurement arrangement for measuring a voltage potential at the conductor 18 in the interior of the encapsulated power switching device 12 will be described again below in other words.

The measurement electrode 30 for measuring voltage is mounted outside of the switch housing 10 at the base of the high-voltage insulator 26. Openings (apertures 32) pass through the field-controlling component 24, that is to say the field control electrode 22 of the high-voltage bushing 14. The openings 32 in the field control electrode 22 interrupt the shielding effect. The electric field of the primary conductor 18 can affect the measurement electrode 30. Capacitive coupling between the primary conductor 18 and the measurement electrode 30 is therefore achieved and measurement of the primary voltage even in the vicinity of a current measurement is made possible.

LIST OF REFERENCE SIGNS 10 switch housing
12 power switching device
14 high-voltage bushing
16 aperture
18 conductor
20 axis
22 field control electrode
24 field control component
26 high-voltage insulator
28 encapsulation
30 measurement electrode
32 aperture
34 collar
36 flanged rim
38 wall
40 bar
A portion
H height

The invention claimed is:

1. A voltage potential measurement arrangement for measuring a voltage potential at a conductor in an interior of an encapsulated power switching device, the voltage potential measurement arrangement comprising:
 a field control component or a field control electrode surrounding at least one portion of the conductor;
 a measurement electrode for capacitive coupling to the conductor, said measurement electrode disposed outside of said field control component; and
 said field control component having at least one aperture passing through said field control component at a height of said measurement electrode.

2. The voltage potential measurement arrangement according to claim 1, wherein said measurement electrode has an annular shape, and said at least one aperture includes a plurality of circumferentially distributed apertures passing through said field control component at the height of said measurement electrode.

3. The voltage potential measurement arrangement according to claim 1, wherein an encapsulation being a high-voltage insulator circumferentially surrounds said field control component at least at the height of said measurement electrode.

4. The voltage potential measurement arrangement according to claim 3, wherein said measurement electrode is disposed outside of the high-voltage insulator.

5. The voltage potential measurement arrangement according to claim 1, wherein said field control component directly adjoins a switch housing of the power switching device.

6. The voltage potential measurement arrangement according to claim 1, wherein at least two components selected from the group consisting of the conductor, said field control component and said measurement electrode are oriented coaxially.

7. An encapsulated power switching device, comprising:
 a switch unit;
 a conductor electrically connected to said switch unit;
 an encapsulation;
 a field control component; and
 a measurement electrode for measuring a voltage potential at said conductor, said measurement electrode being disposed outside of said field control component; and
 said field control component having at least one aperture passing through said field control component at a height of said measurement electrode.

8. The power switching device according to claim 7, wherein said measurement electrode has an annular shape, and said at least one aperture includes a plurality of circumferentially distributed apertures passing through said field control component at the height of said measurement electrode.

9. The power switching device according to claim 7, wherein said encapsulation is a high-voltage insulator circumferentially surrounding said field control component at least at the height of said measurement electrode.

10. The power switching device according to claim 9, wherein said measurement electrode is disposed outside of said high-voltage insulator.

11. The power switching device according to claim 9, which further comprises a switch housing for housing said switch unit, said field control component directly adjoining said switch housing.

* * * * *